(12) United States Patent
Rao et al.

(10) Patent No.: US 7,091,130 B1
(45) Date of Patent: Aug. 15, 2006

(54) METHOD OF FORMING A NANOCLUSTER CHARGE STORAGE DEVICE

(75) Inventors: Rajesh A. Rao, Austin, TX (US); Ramachandran Muralidhar, Austin, TX (US); Robert F. Steimle, Austin, TX (US); Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 166 days.

(21) Appl. No.: 10/876,820

(22) Filed: Jun. 25, 2004

(51) Int. Cl.
*H01I 21/302* (2006.01)

(52) U.S. Cl. .................. 438/720; 438/197; 438/201; 438/257; 438/261; 438/501; 438/506; 438/720; 257/270; 257/316; 257/324; 257/411

(58) Field of Classification Search ............... 438/197, 438/201; 257/270, 316
See application file for complete search history.

(56) References Cited

U.S. PATENT DOCUMENTS

| | | | |
|---|---|---|---|
| 6,297,095 B1 | 10/2001 | Muralidhar et al. | |
| 6,320,784 B1 | 11/2001 | Muralidhar et al. | |
| 6,444,545 B1 | 9/2002 | Sadd et al. | |
| 6,958,265 B1 * | 10/2005 | Steimle et al. | 438/211 |
| 7,015,090 B1 | 3/2006 | Okazaki et al. | |
| 2004/0135204 A1 * | 7/2004 | Wang et al. | 257/348 |
| 2004/0212019 A1 | 10/2004 | Shinohara | |
| 2005/0098822 A1 | 5/2005 | Mathew | |

OTHER PUBLICATIONS

S., Wolf, Silicon Processing for the VLSI Era, vol. 4, Lattice Press Press (2002) pp. 385-386.*
Cavins et al., "A Nitride-Oxide Blocking Layer for Scaled SONOS Non-Volatile Memory," *Motorola, Inc.*, Jan. 10, 2002, 5 pages.
Cavins et al., "Integrated Stacked Gate Oxide and Interpoly Oxide," *Motorola, Inc.,*, Nov. 1996, pp. 93-94.
Attorney Docket No. SC13087TP filed concurrently.
U.S. Appl. No. 10/987,047, filed Nov. 12, 2004.

* cited by examiner

*Primary Examiner*—Nadine Norton
*Assistant Examiner*—Maki Angadi
(74) *Attorney, Agent, or Firm*—Robert L. King; Michael P. Noonan (57) ABSTRACT

A plurality of memory cell devices is formed by using an intermediate dual polysilicon-nitride control electrode stack overlying nanoclusters. The stack includes a first-formed polysilicon-nitride layer and a second-formed polysilicon-containing layer. The second-formed polysilicon-containing layer is removed from areas containing the plurality of memory cells. In one form the second-formed polysilicon-containing layer also contains a nitride portion which is also removed, thereby leaving the first-formed polysilicon-nitride layer for the memory cell devices. In another form the second-formed ploysilicon-containing layer does not contain nitride and a nitride portion of the first-formed polysilicon-nitride layer is also removed. In the latter form a subsequent nitride layer is formed over the remaining polysilicon layer. In both forms a top portion of the device is protected from oxidation, thereby preserving size and quality of underlying nanoclusters. Gate electrodes of devices peripheral to the memory cell devices also use the second-formed polysilicon-containing layer.

22 Claims, 12 Drawing Sheets

METHOD OF FORMING A NANOCLUSTER CHARGE STORAGE DEVICE

CROSS-RELATED APPLICATION

This application is related to copending U.S. patent application Ser. No. 10/876,805 by Robert F. Steimle entitled "Method of Forming A Nanocluster Charge Storage Device" filed simultaneously herewith and assigned to the assignee of record herein.

BACKGROUND

1. Field

The present invention relates to semiconductor devices, and, more particularly, to such devices having nanoclusters.

2. Description of the Related Art

Some devices such as memories (e.g. non volatile memories) utilize discrete charge storage elements called nanoclusters (e.g. of silicon, aluminum, gold, or germanium) for storing charge in a charge storage location of a transistor. In some examples, the nanoclusters are located between two dielectric layers, a bottom dielectric and a control dielectric. Examples of such transistors include thin film storage transistors. A memory typically includes an array of such transistors. Examples of nanocluster types includes doped and undoped semiconductor nanoclusters such as silicon nanocrystals, germanium nanocrystals and their alloys. Other examples of nanocluster types include various conductive structures such as metal nanoclusters (e.g., gold nanoclusters and aluminum nanoclusters), and metal alloy nanoclusters. In some examples, nanoclusters are from 10–100 Angstroms in size.

Some memories that have charge storage transistors with nanoclusters are implemented on integrated circuits that also include high voltage transistors in the circuitry used for charging and discharging the charge storage locations of the charge storage transistors. Charging or discharging the charge storage locations is used to store one or more bits of information, and may be referred to as programming or erasing. These high voltage transistors typically include a relatively thick gate oxide. This gate oxide may be formed under severe oxidizing conditions. This oxidizing ambient may penetrate the control dielectric of the charge storage transistors thereby undesirably oxidizing the nanocrystals and undesirably increasing the bottom dielectric thickness. Accordingly, an improved method for making a device with nanoclusters is desirable.

BRIEF DESCRIPTION OF THE DRAWINGS

The present invention may be better understood, and its numerous objects, features, and advantages made apparent to those skilled in the art, by referencing the accompanying drawings.

FIGS. 1–10 and 16–23 of the drawings illustrate a series of partial side views of a semiconductor device during various stages of manufacture of an integrated circuit according to a second embodiment of the present invention.

The use of the same reference symbols in different drawings indicates similar or identical items. Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE PREFERRED EMBODIMENT(S)

The following discussion is intended to provide a detailed description of at least one example of the invention and should not be taken to be limiting of the invention itself. Rather, any number of variations may fall within the scope of the invention which is properly defined in the claims following this description.

FIGS. 1–16 show partial side views of a semiconductor wafer during stages in the manufacture of a memory including nanoclusters according to a first embodiment of the present invention. As will be described later, the presently disclosed embodiment utilizes an intermediate dual polysilicon-nitride control electrode stack including a first formed polysilicon-nitride structure and a second formed polysilicon-nitride structure. The second formed polysilicon-nitride structure is removed while periphery device control electrodes are patterned, leaving first formed polysilicon-nitride control electrode structure for the memory cell devices. Such a technique allows protection of a top portion of a nanocluster oxide layer, thereby preserving thickness and quality of such oxide layer.

Figure 1:
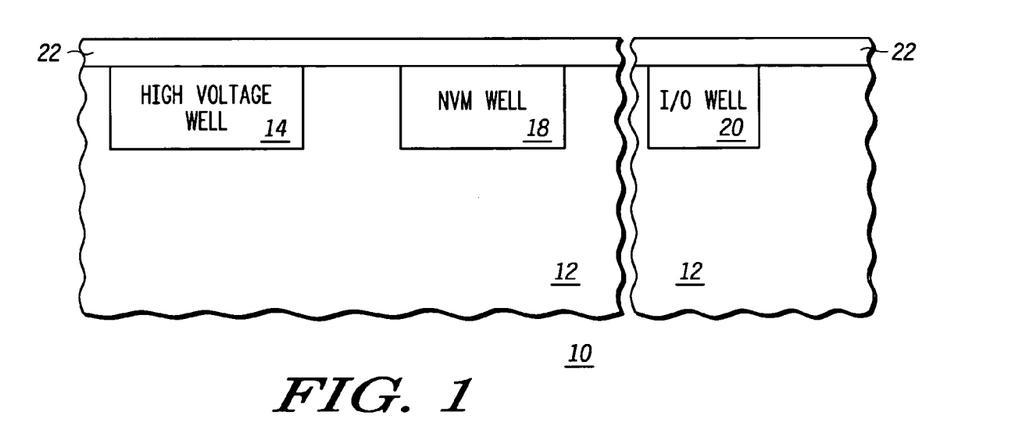
FIGS. 1–16 of the drawings illustrate a series of partial side views of a semiconductor device during various stages of manufacture of an integrated circuit according to a first embodiment of the present invention.

FIG. 1 shows a semiconductor device 10. Semiconductor device 10 is an integrated circuit die. Semiconductor device 10 includes substrate 12 which is part of an overall wafer at the presently illustrated stage of manufacture. Semiconductor device 10 also includes various dopant wells 14, 18 and 20 which form part of the functional circuitry of semiconductor device 10. Substrate also includes various pre-formed shallow trench isolation structures (not shown) to separate different devices and to laterally separate the wells discussed herein. Semiconductor device 10 also includes a bottom oxide layer 22.

Dopant wells 14, 18 and 20 may take various forms. Non-volatile memory (NVM) well 18 forms part of storage cell circuitry of a non-volatile memory array. In the illustrated embodiment, NVM well 18 is a p-well in which an array of storage cells will reside. Although in some contexts periphery devices include only high voltage (HV) devices (e.g., cell charge/discharge devices), in the embodiments discussed herein, periphery devices include various devices outside the NVM storage cell array and may include HV devices, integrated circuit die input/output (I/O) devices, and low (LV) voltage devices (e.g., logic devices). High voltage (HV) well 14 forms part of circuitry (e.g., high voltage transistors) for programming and erasing cells of the NVM array. The illustrated HV well 14 is an n-well. Semiconductor device may alternatively or additionally include an HV p-well within a deep n-type isolation well. I/O well 20 forms part of the I/O circuitry of semiconductor device 10. The illustrated I/O well 20 is an n-well. Semiconductor device may alternatively or additionally include an I/O p-well within a deep n-type isolation well. In one embodiment, I/O well 20 is a dual gate oxide (DGO) well.

Silicon dioxide layer 22 provides a tunnel dielectric layer. Other dielectrics may be used for oxide layer 22 such as silicon oxynitride, hafnium oxide, aluminum oxide, lanthanum oxide, or lanthanum silicate. Dielectric layer 22 has been formed over substrate 12, for example, by oxidation or chemical vapor deposition. In one embodiment, bottom dielectric has thickness of 5 nanometers, but may be of other thicknesses in other embodiments.

Figure 2:
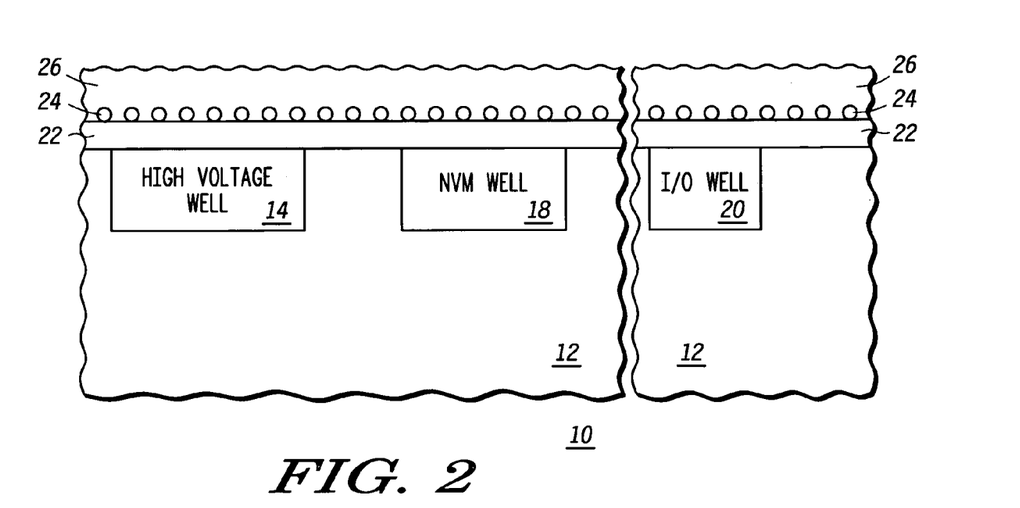

Referring to FIG. 2, a layer of nanoclusters 24 (e.g. of silicon, aluminum, gold, germanium, or a silicon and germanium alloy or other types of conductive material or doped or undoped semiconductive material) is formed over oxide layer 22 by, e.g., chemical vapor deposition techniques, aerosol deposition techniques, spin on coating techniques, or self assembly techniques such as annealing a thin film to form nanoclusters. In one embodiment, the nanoclusters 24 are silicon nanocrystals. In one embodiment where the nanoclusters are utilized in a non volatile memory, the nanoclusters have a planar density of $1\times10^{12}$ cm$^{2}$ with a size of 5 to 7 nanometers. In some embodiments, nanoclusters are from 10–100 Angstroms in size. However the nanoclusters in other embodiments may be of other sizes and/or other densities. In one embodiment, nanoclusters 24 are separated by average distance generally equal to an average size of clusters. The average distance in one such embodiment is greater than 4 nanometers. Although nanoclusters 24 are shown as having a uniform size and distribution, nanoclusters 24 will have nonuniform sizes and a nonuniform distribution in actual practice. Nanoclusters 24 will be utilized for implementing charge storage locations in transistors (see FIG. 16) of a non-volatile memory of semiconductor device 10.

After nanoclusters 24 are deposited, a layer of dielectric material (e.g. silicon dioxide, silicon oxynitride, hafnium oxide, aluminum oxide, lanthanum oxide, and lanthanum silicate) is formed over nanocrystals 24 (e.g., by chemical vapor deposition) to form a control dielectric layer 26. In one embodiment, a silicon dioxide layer is deposited over the nanoclusters. Alternately, other dielectrics such as silicon oxynitride, hafnium oxide, aluminum oxide, lanthanum oxide, or lanthanum silicate may be used for layer 26. In another embodiment an oxide-nitride-oxide (ONO) stack of silicon dioxide, silicon nitride, and silicon dioxide may be used for layer 26. In one embodiment, dielectric layer 26 has a thickness of approximately 5–15 nanometers, but may be of other thicknesses in other embodiments.

In some embodiments, the bottom dielectric 22, nanoclusters 24, and control dielectric 26 may be formed by ion implantation (e.g. silicon or germanium) into a layer of dielectric material (not shown) followed by the annealing of the ions to form nanocrystals in the layer of dielectric material. In other embodiments, bottom dielectric 22, nanoclusters 24 and control dielectric 26 may be formed by recrystallization of a silicon rich oxide layer between two layers of dielectric material to form the nanoclusters. In other embodiments, the nanoclusters may be implemented in multiple layers located above the bottom dielectric. In other embodiments, the nanoclusters are formed by depositing a thin amorphous layer of nanocluster material (e.g. 1–5 nanometers) wherein the resultant structure is annealed in a subsequent annealing process.

Figure 3:
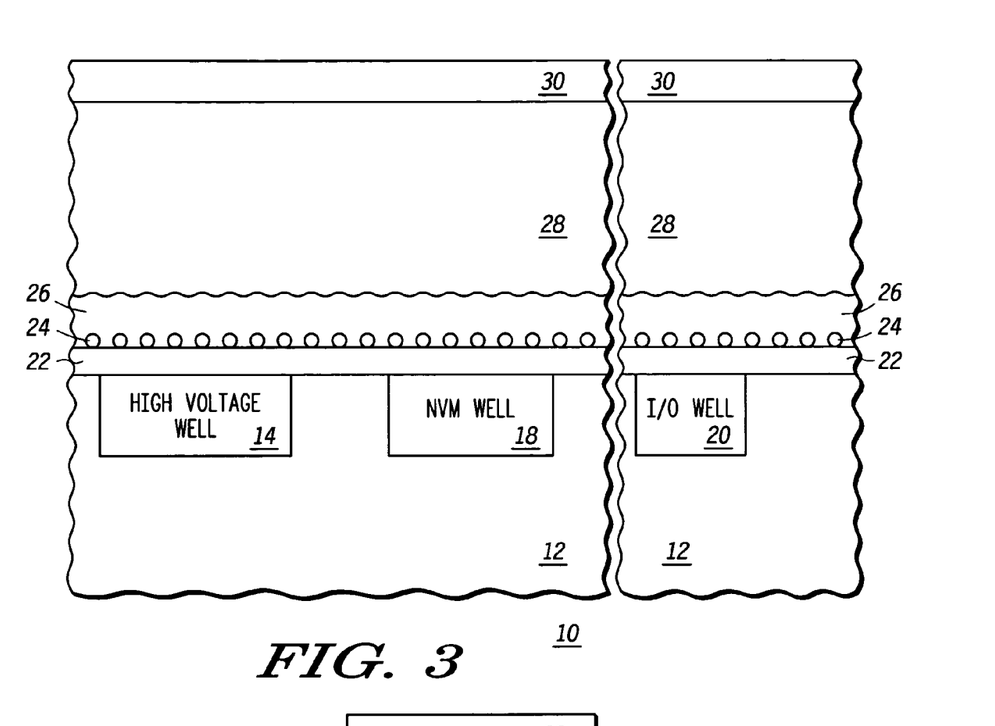

Referring to FIG. 3, a doped polysilicon layer 28 is formed over dielectric layer 26. A portion of polysilicon layer 28 will serve as a gate electrode of an NVM bit cell. The polysilicon layer may be in situ doped (during deposition) or by implantation (after deposition). Other gate electrode materials may be used such as metals. After gate electrode 28 is deposited, an anti-reflective coating (ARC) is deposited. In the illustrated embodiment, silicon nitride layer 30 provides the anti-reflective coating.

Figure 4:
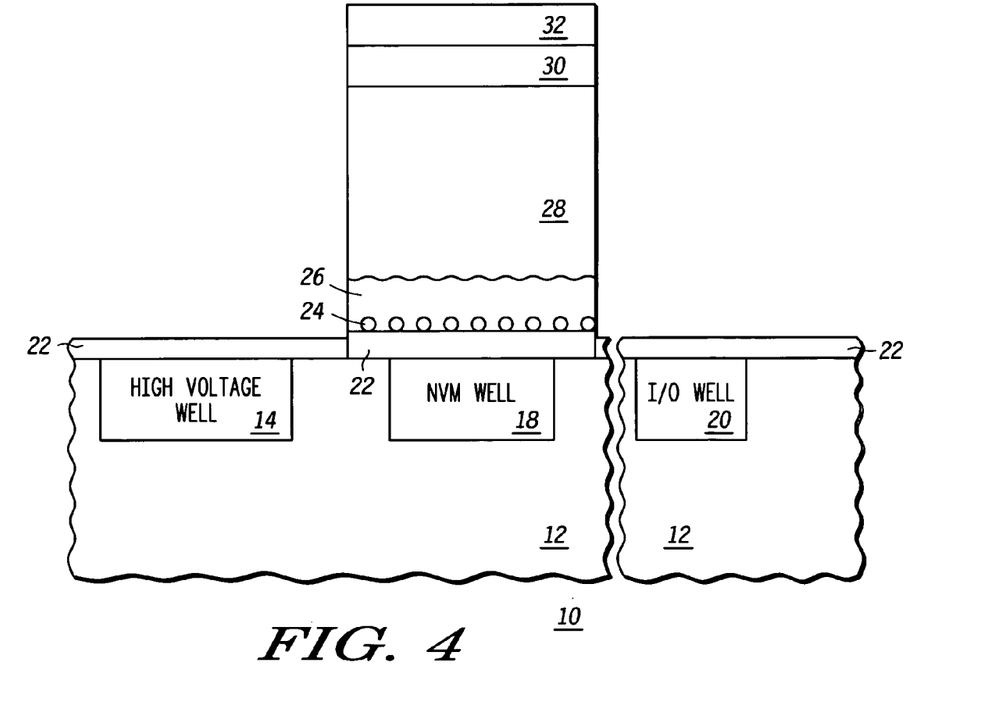

Referring to FIG. 4, a masking layer 32 (e.g., a photoresist) is formed over nitride layer 30. Masking layer 32 protects the gate stack over NVM well 18 and exposes portions of layers 30, 28, 26, 24 and 22 from other areas of semiconductor device 10. Nitride layer 30, polysilicon layer 28, dielectric layer 26 and nanocluster layer 24 are subsequently removed. Part of layer 22 is also subsequently removed. In one embodiment, reactive ion etching is used to remove layers 30, 28, 26, 24 and 22.

Figure 5:
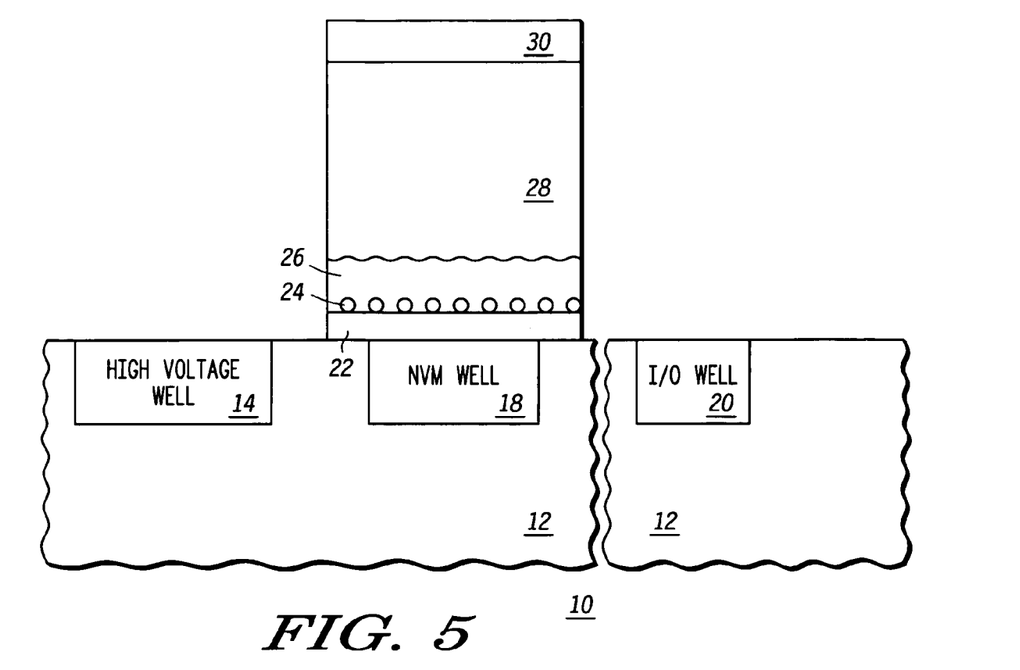

Referring to FIG. 5, masking layer 32 has been removed to expose the nitride, and the remainder of the exposed portions of tunnel dielectric layer 22 have been removed to expose the substrate. In an embodiment in which tunnel dielectric layer 22 is silicon dioxide, the removal may be performed via a wet etch using dilute hydrofluoric acid.

Figure 6:
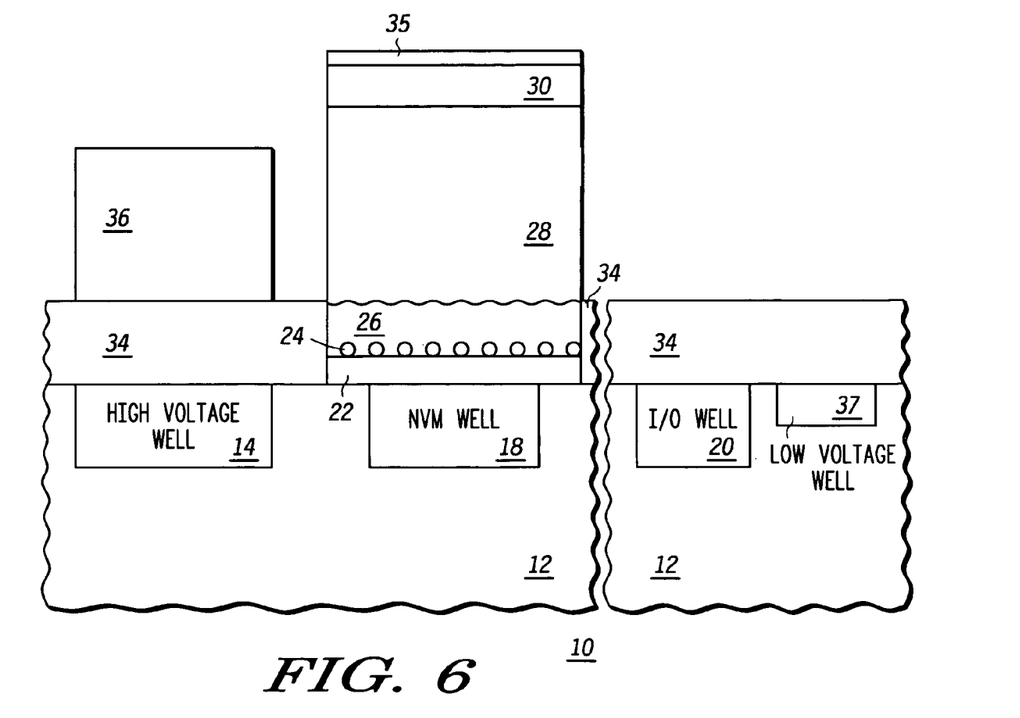

Referring to FIG. 6, the high voltage device oxide layer 34 is formed. For example HV oxide layer 34 may be grown by oxidation in oxygen or steam. One exemplary oxide layer 34 is silicon dioxide having a thickness between 5 and 15 nanometers. Oxide layer 35 is concomitantly grown over nitride layer 30, typically having a smaller thickness. During this aggressive oxidation step, the nitride layer 30 serves as a diffusion barrier and protects the underlying nanoclusters 24, the polysilicon layer 26, and tunnel dielectric 22 from deleterious oxidation. Such oxidation, if allowed to occur, can adversely influence the NVM device performance since programming and erasing of the nanoclusters is very sensitive to the dielectric layer 22 thickness and the nanocluster size.

Subsequently, the low voltage device wells 37 for general logic circuitry are formed by implantation into substrate 12. A conventional implantation process follows the opening of the low voltage areas by a masking step. The HV oxide layer 34 serves as a sacrificial oxide for the low voltage well implants. The logic well is activated typically by a rapid thermal annealing process.

After formation of the logic wells 37, masking layer 36 (e.g., a photoresist) is formed over HV oxide layer 34 to protect portions of the HV oxide layer over the HV device well 14 and to expose other portions of the HV oxide layer.

Figure 7:
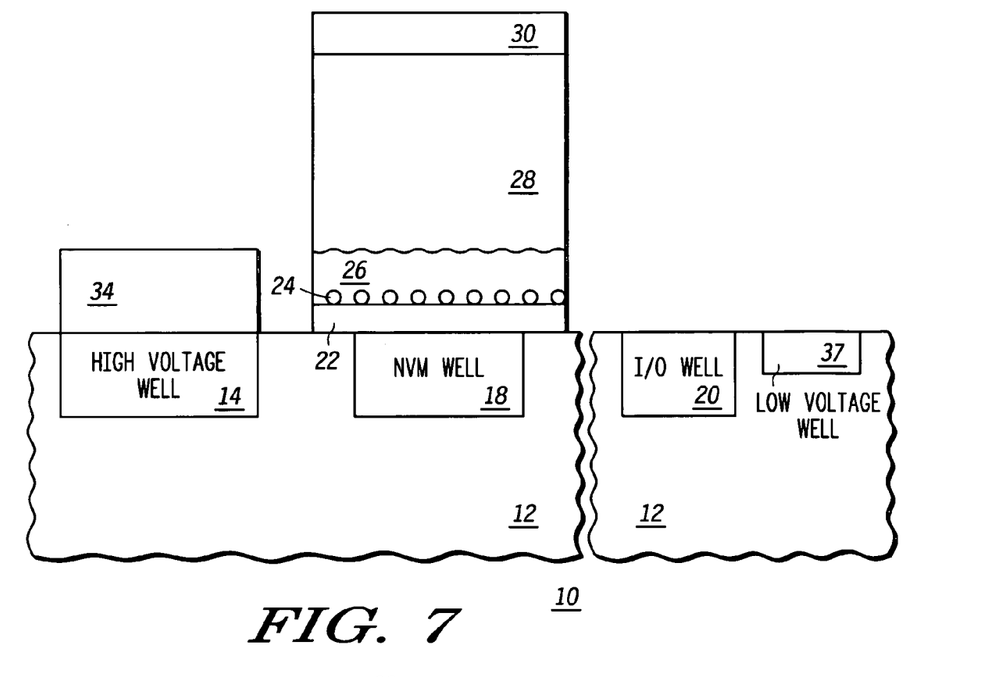

Referring to FIG. 7, exposed portions of the HV oxide layer 34 are removed via a wet etch using dilute hydrofluoric acid. Oxide layer 35 is removed concomitantly with exposed portions of layer 34. After the exposed portions of the HV oxide layers 34 and 35 are removed, the masking layer 36 is also removed.

Figure 8:
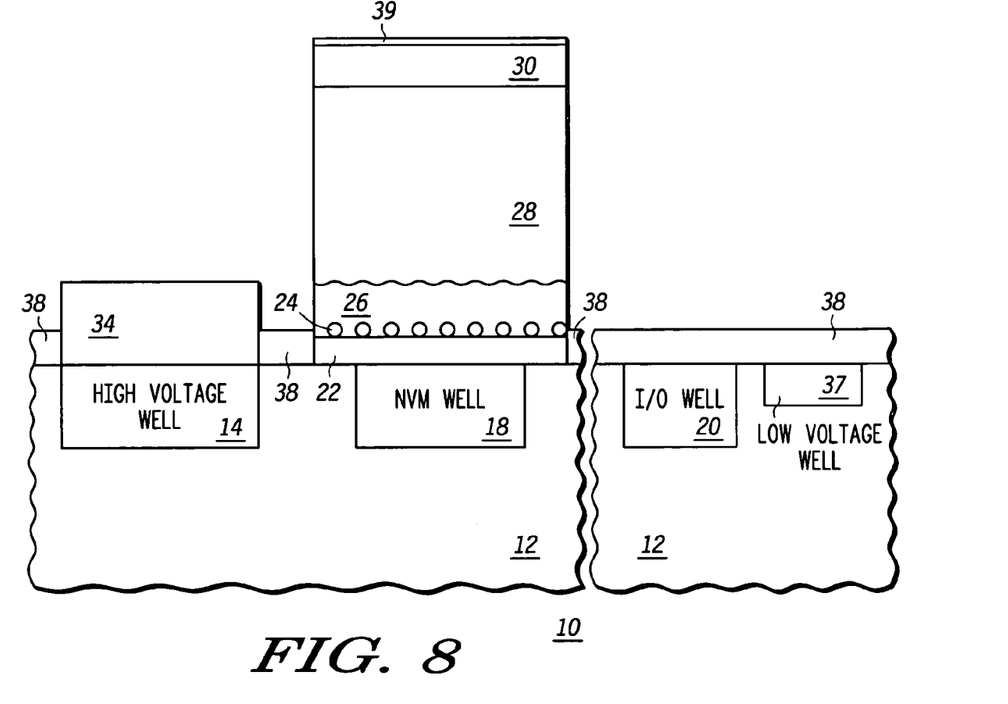

Referring to FIG. 8, I/O device oxide layer 38 is formed. Although other methods may be used, oxide layer 38 is typically grown by oxidation in oxygen. Other oxygen compounds such as $N_2O$ may be used. One exemplary oxide layer 38 is silicon dioxide. I/O oxide layer 38 is generally slightly thinner than HV oxide layer 34, having a thickness between 4 and 8 nanometers. Thin oxide layer 39 is concomitantly grown over nitride layer 30. HV oxide layer 34 is naturally thickened during the growth of I/O oxide layer 38. During this oxidation step, the nitride layer 30 again serves as a diffusion barrier and protects the underlying nanoclusters 24 and tunnel dielectric 22 from deleterious oxidation. Such oxidation, if allowed to occur, can adversely influence the NVM device performance since programming and erasing of the nanoclusters is very sensitive to the dielectric layer 22 thickness and the nanocluster size.

Figure 9:
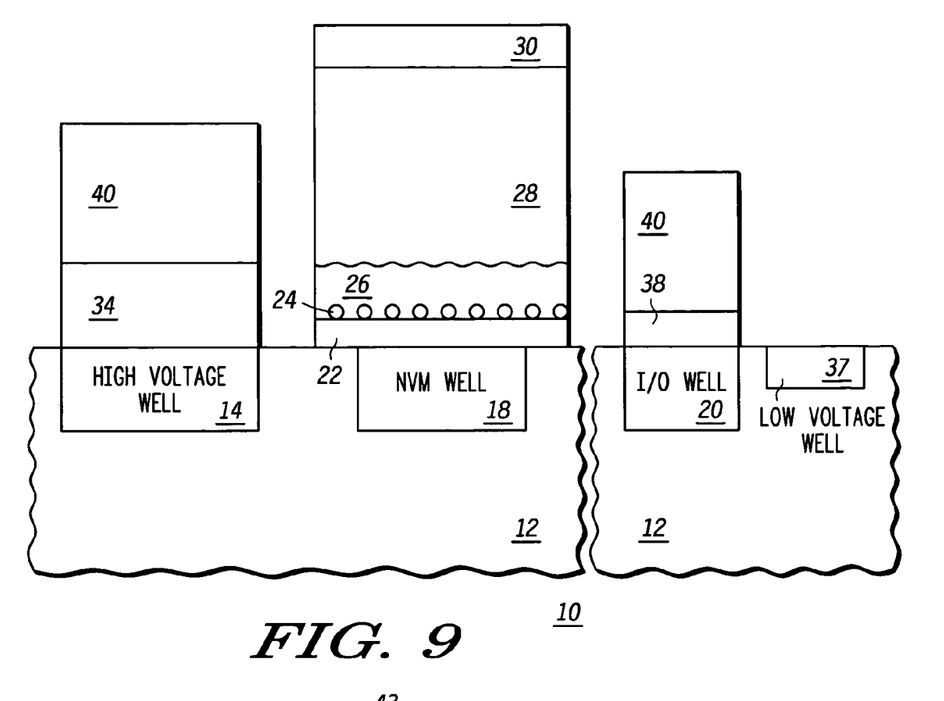

Referring to FIG. 9, masking layer 40 (e.g., a photoresist) is formed over I/O oxide layer 38 to protect portions of the HV and I/O oxide layers 34 and 38 over respective HV and I/O device wells 14 and 20, and to expose other portions of the I/O oxide layer. Next, the exposed portions of I/O oxide layer 38 are removed using, for example, a wet etch of dilute hydrofluoric acid. Concomitantly, thin oxide layer 39 over nitride layer 30 is also removed.

Figure 10:
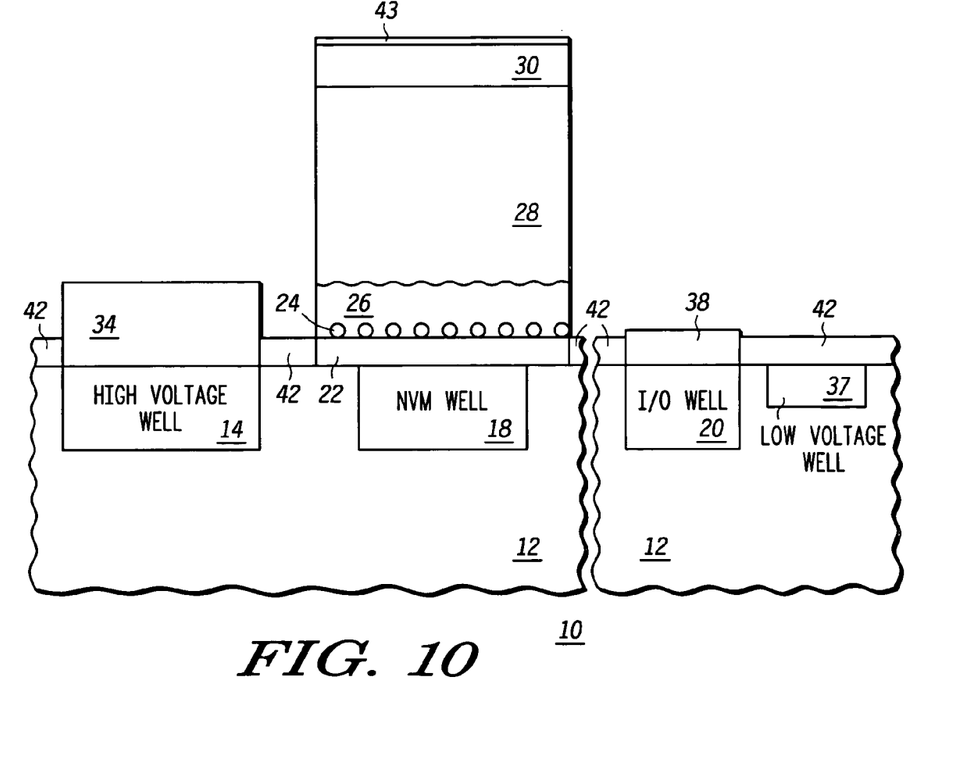

Referring to FIG. 10, photoresist layer 40 is removed from over HV oxide layer 34 and I/O oxide layer 38. Low voltage (LV) oxide 42 is formed. Although other methods may be used, oxide layer 42 is typically grown by oxidation in oxygen, $N_2O$ or NO. One exemplary oxide layer 42 is silicon dioxide. LV oxide layer 42 is generally slightly thinner than HV oxide layer 34 and I/O oxide layer 38, having a thickness between 1.5 and 3 nanometers. A very thin oxide layer 43 may be concomitantly grown over nitride layer 30. HV oxide layer 34 and I/O oxide layer 38 may be naturally thickened during the growth of LV oxide layer 42. During this oxidation step, the nitride layer 30 again serves as a diffusion barrier and protects the underlying nanoclusters 24 and tunnel dielectric 22 from any further oxidation.

Figure 11:
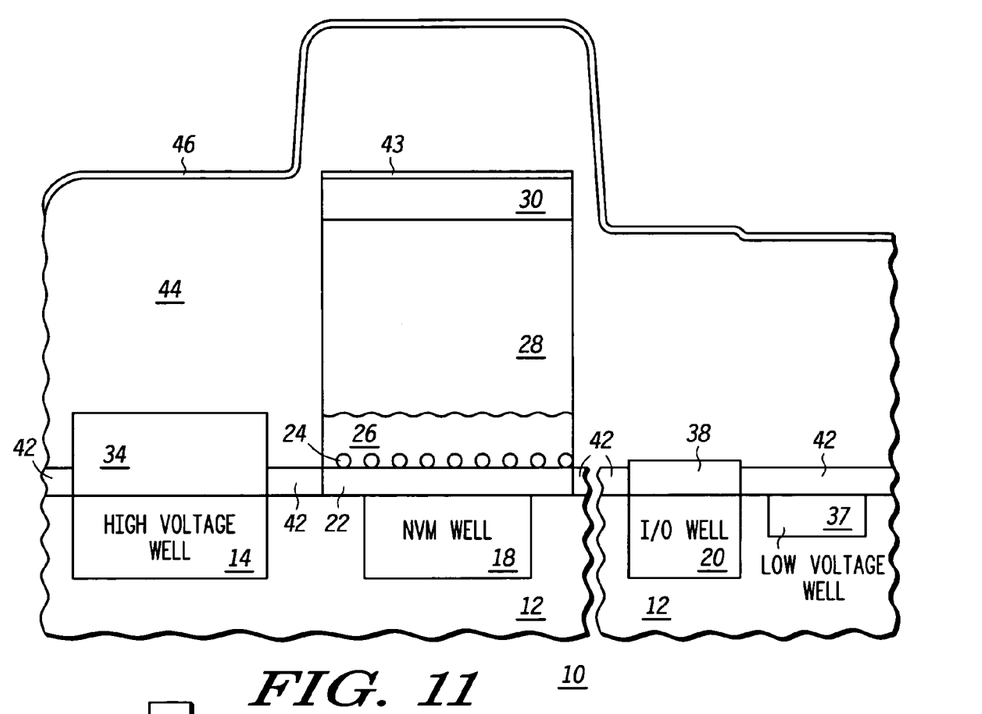

Referring to FIG. 11, a doped polysilicon layer 44 is formed over substrate 12. In the illustrated embodiment, polysilicon layer 44 is deposited over LV oxide layer 42, HV oxide layer 34, I/O oxide layer 38 and incidental oxide layer 43. Portions of polysilicon layer 44 will serve as gate electrodes of HV, LV and I/O devices. When polysilicon is used as the gate electrode for the periphery and NVM array devices, typically, the two layers are approximately the same thickness. In other embodiments, different materials with appropriate thicknesses may be used for periphery and NVM array gate electrodes. Polysilicon layer 44 may be in situ doped (during deposition) or by implantation (after deposition). Other gate electrode materials may be used such as metals. After gate electrode 44 is deposited, an anti-reflective coating (ARC) is deposited. In the illustrated embodiment, silicon nitride layer 46 provides the anti-reflective coating.

Figure 12:
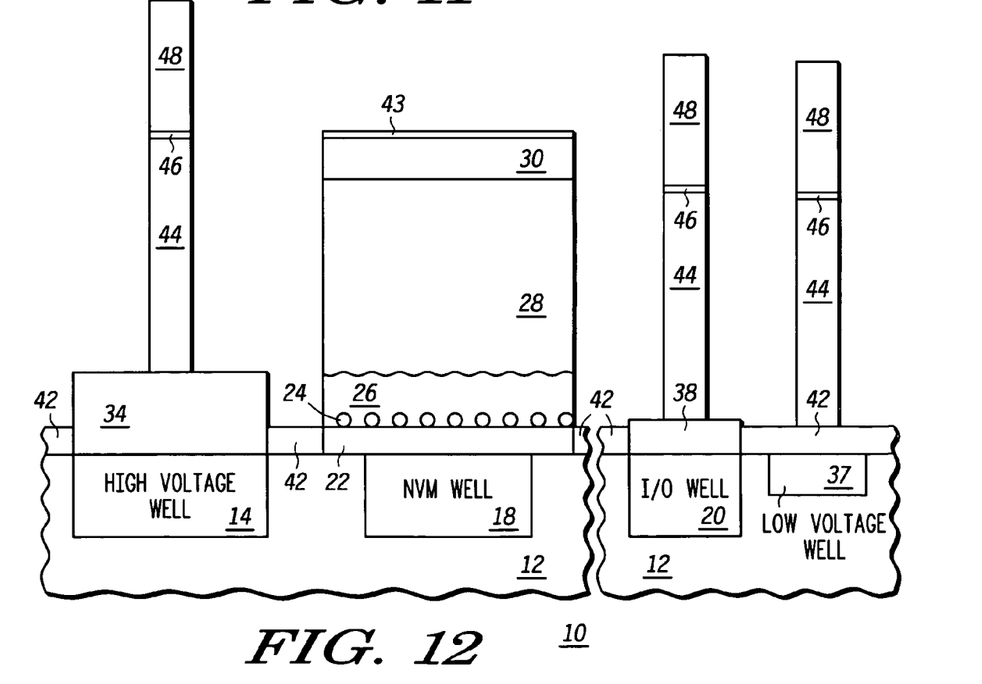

Referring to FIG. 12, masking layer 48 (e.g., a photoresist) is formed on nitride layer 46 over periphery devices and serves to pattern the gates for such devices, after which the exposed portions of layers 44 and 46 are removed using, for example, an anisotropic plasma etch. During this gate patterning step, portions of polysilicon layer 44 and nitride layer 46 overlying the NVM areas are removed while the gate electrodes (e.g., portions of layer 44) of the LV, HV and I/O devices are allowed to remain. Using a reactive ion etch selective to the layers 43 and 30 results in a substantially complete removal of the gate electrode material layer 44 and ARC layer 46 from over the NVM array area while simultaneously patterning the gate electrodes for the I/O, HV and LV devices.

Figure 13:
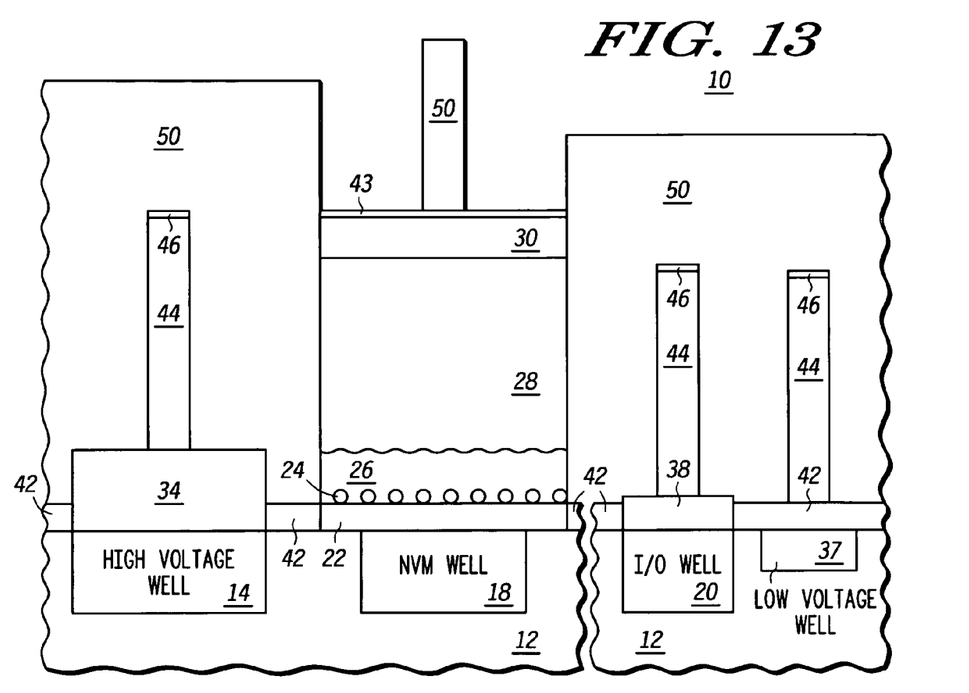

Referring to FIG. 13, masking layer 48 is removed. A masking layer 50 (e.g., a photoresist) is formed over periphery device areas corresponding to HV well 14, I/O well 20 and LV well 37 and other areas. The masking layer serves to pattern the gate electrodes for NVM array devices and to protect the periphery portions of semiconductor device 10.

Figure 14:
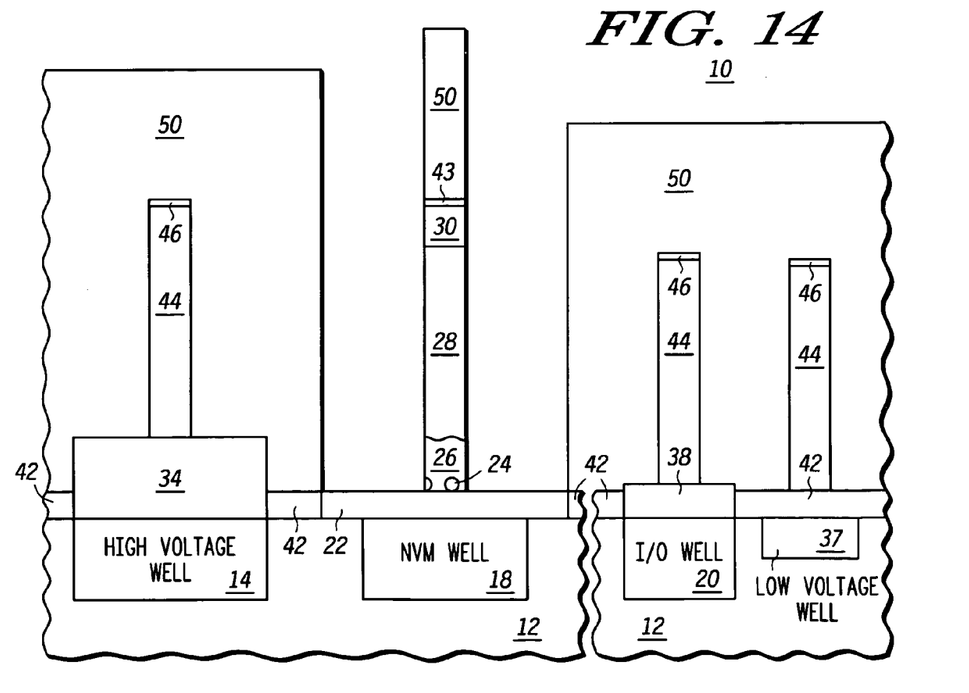

Referring to FIG. 14, various portions of layers exposed by masking layer 50 are removed (e.g., via a nonselective, anisotropic, timed, plasma etch). For example, exposed portions thin oxide layer 43, nitride ARC layer 30, gate electrode layer 28, control dielectric 26 and nanocluster layer 24 are removed. Part of tunnel dielectric layer 22 is also removed.

Figure 15:
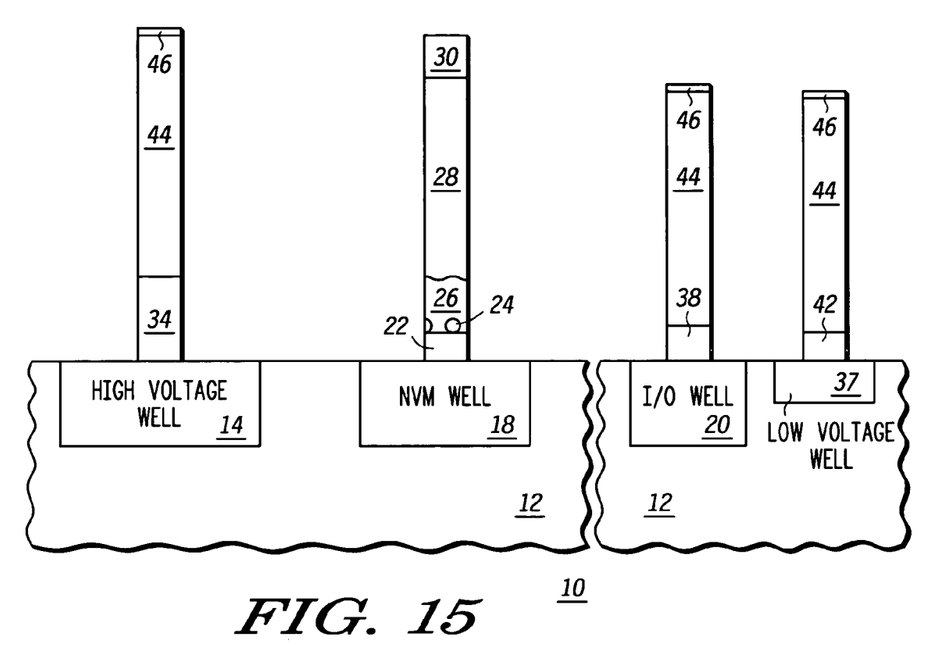

Referring to FIG. 15, masking layer 50 is removed. Any remaining exposed portions of low voltage oxide layer 42, high voltage oxide layer 34, NVM tunnel dielectric 22 and I/O oxide layer 38 are removed by using wet etch processes. Very thin oxide 43 over the NVM ARC layer 30 is also removed. In an embodiment where all the oxide layers 34, 38 and 42 are silicon dioxide, a dilute hydrofluoric acid wet clean can be employed for this purpose.

Figure 16:
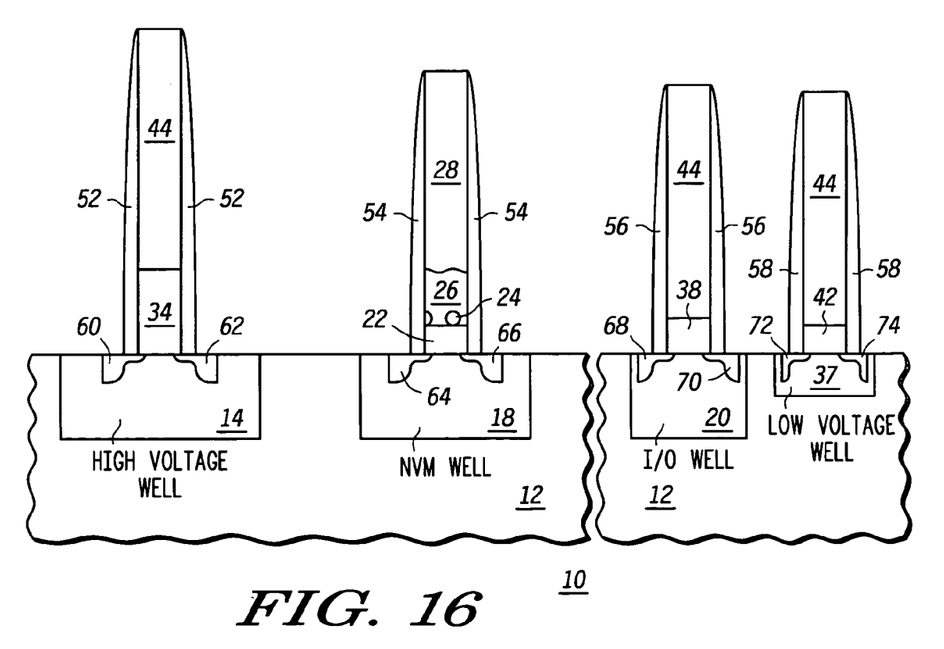

Referring to FIG. 16, the NVM cell and periphery devices are completed. Subsequent to the formation of all of the gate electrodes as described in FIG. 15, standard CMOS processing techniques are used to form source/drain extensions, side-wall spacers and source/drain regions. As illustrated, 60 and 62 represent source/drain regions and extension of an HV device, 64 and 66 represent source/drain regions and extension of an NVM cell, 68 and 70 represent source/drain regions and extension of an I/O device, and 72 and 74 represent source/drain regions and extension of an LV device. Side-wall spacers 52 correspond to an HV device, side-wall spacers 54 correspond to an NVM cell device, side-wall spacers 56 correspond to an I/O device, and side-wall spacers 58 correspond to an LV device.

Figure 17:
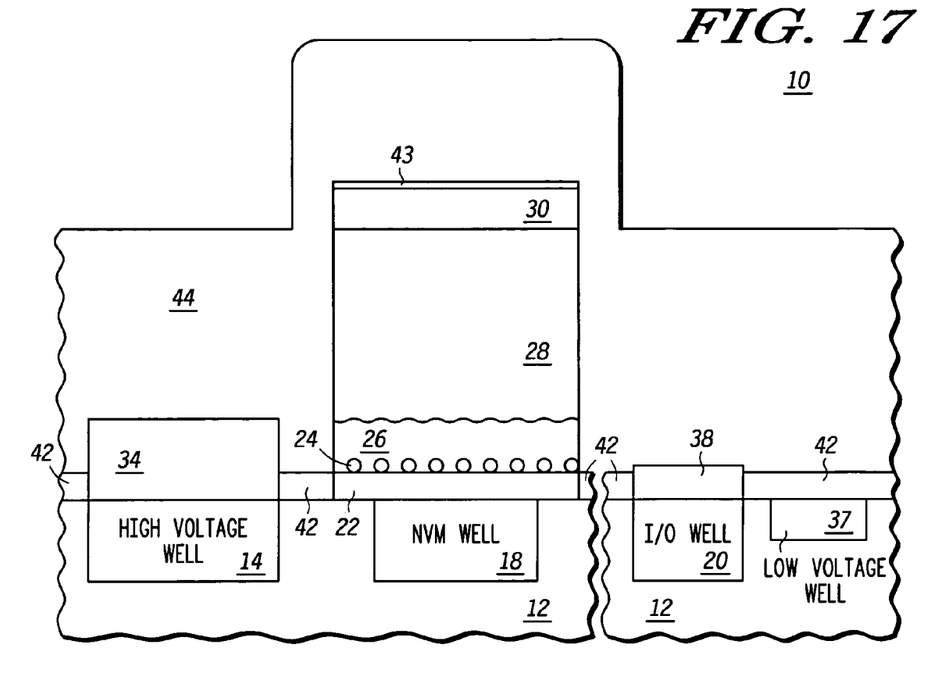

In another embodiment, after the LV oxide 42 is formed as illustrated in FIG. 10, a doped polysilicon layer 44 may be formed over substrate 12 as illustrated in FIG. 17. In the illustrated embodiment, polysilicon layer 44 is deposited over LV oxide layer 42, HV oxide layer 34, I/O oxide layer 38 and incidental oxide layer 43. Portions of polysilicon layer 44 will serve as gate electrodes of HV, LV and I/O devices. In this embodiment, an anti-reflective coating (ARC) is not required at this stage because subsequent etching is for large area and not for a critical dimension.

Figure 18:
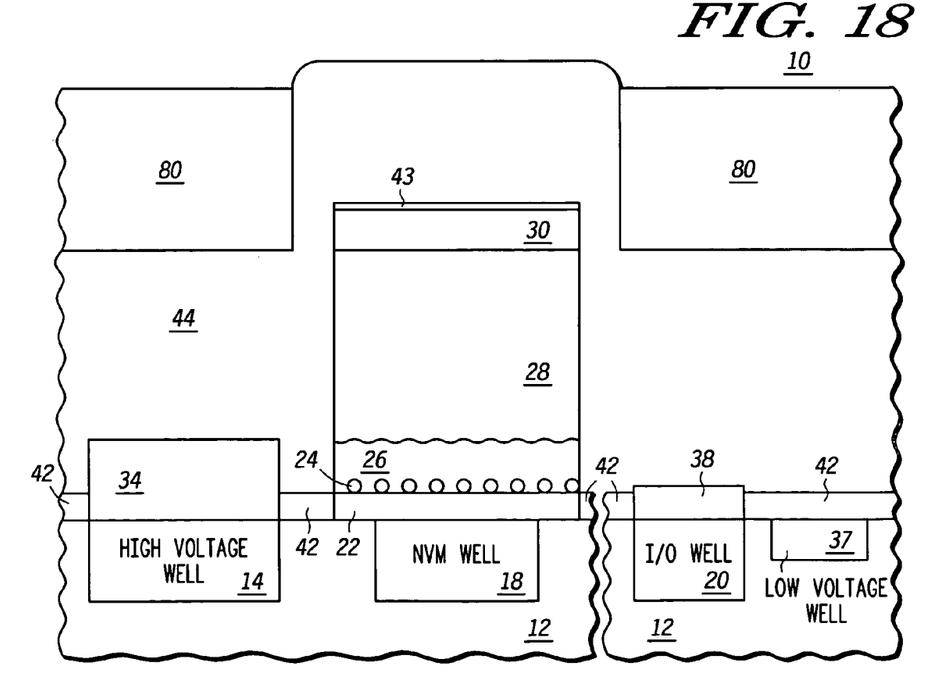
Figure 19:
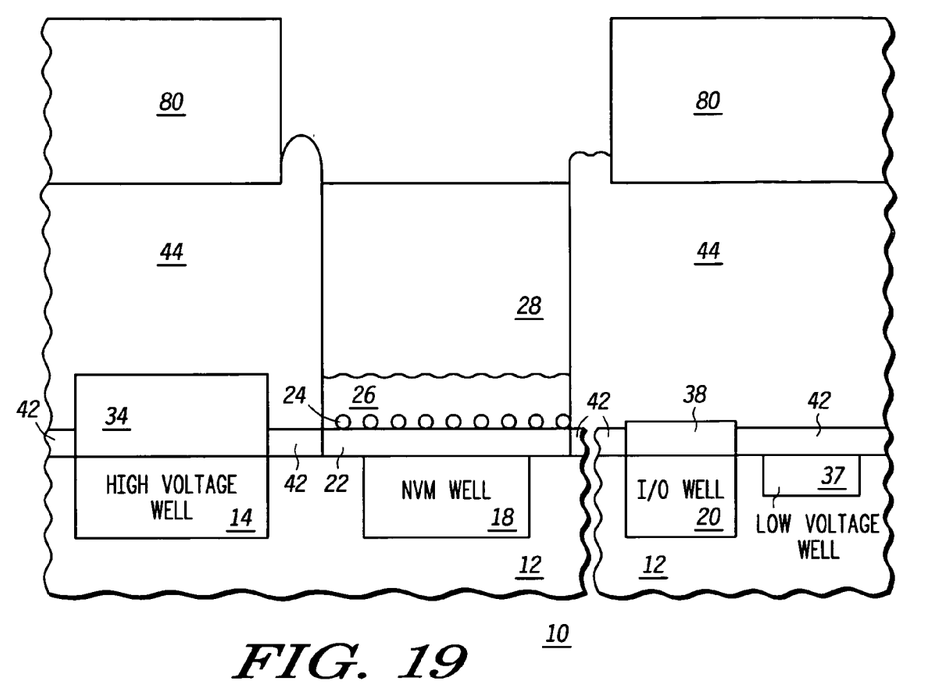
Figure 20:
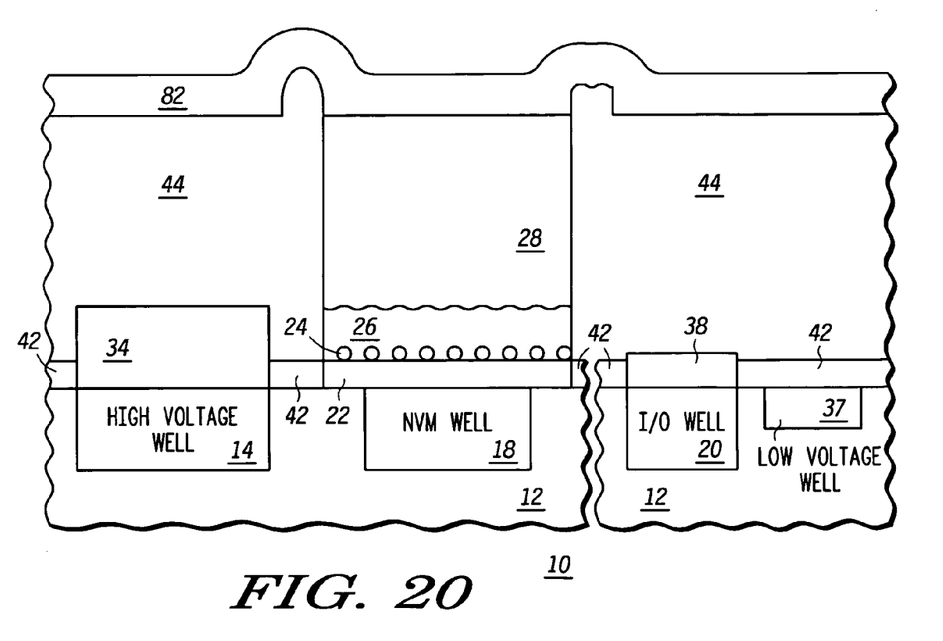
Figure 21:
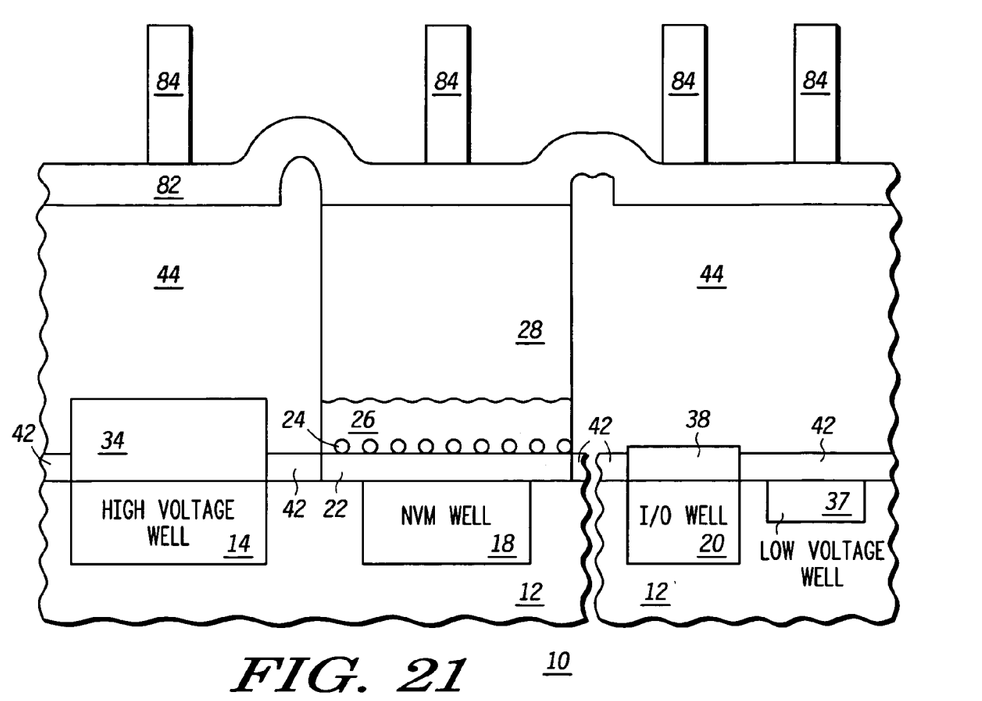
Figure 22:
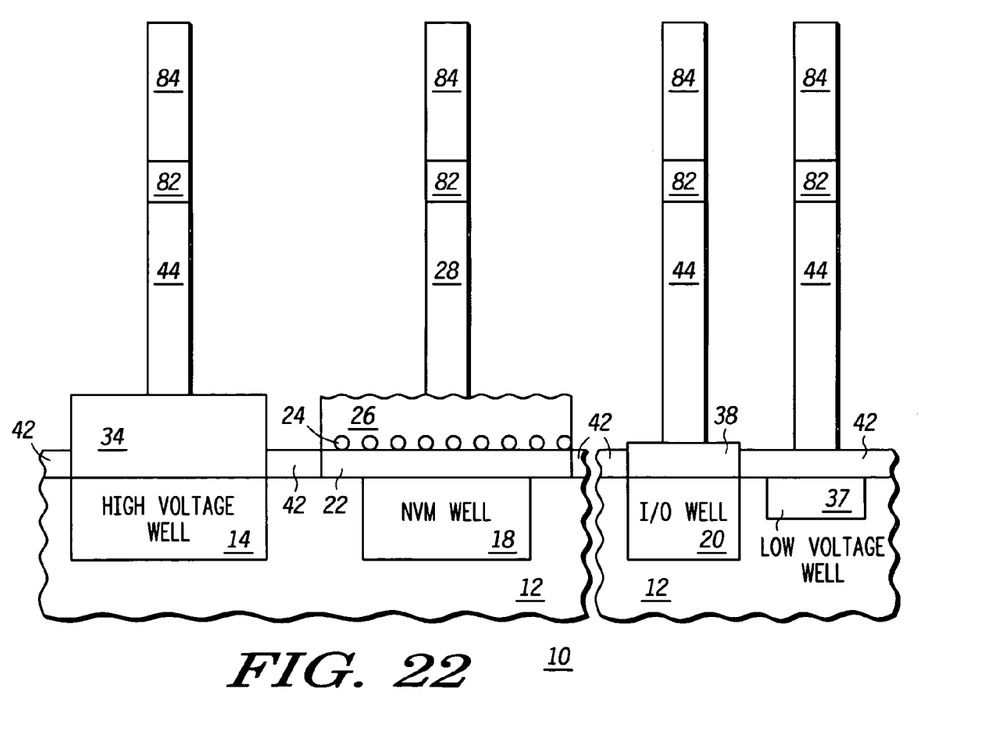
Figure 23:
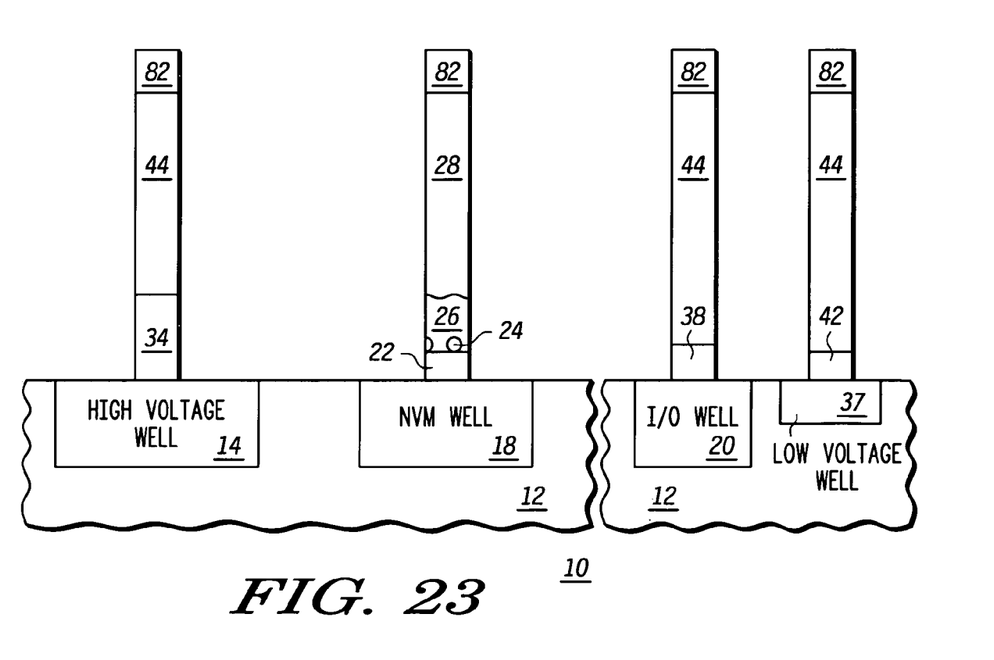

Referring to FIG. 18, a masking layer 80 (e.g., a photoresist) is formed and patterned over the HV, I/O and LV areas and exposing the NVM well area. In FIG. 19, the polysilicon layer 44, thin oxide layer 43 and nitride layer 30 are etched over the NVM area using, for example, a dry etch, a wet etch or combination thereof. In one embodiment, the etch is stopped as a change in chemistry of the materials being etched is detected. In FIG. 20, masking layer 80 is removed (e.g., via a plasma ash process or a piranha resist strip), and an ARC layer 82 is conformally deposited over polysilicon layers 44 and 28. In the illustrated embodiment, silicon nitride is used to provide the anti-reflective coating. In FIG. 21, masking layer 84 is formed over the HV, I/O, LV and NVM areas. In FIG. 22, a dry etch is performed to remove ARC layer 82 and the underlying polysilicon layers 44 and 28, thereby exposing dielectric layers 26, 34, 38 and 42. In FIG. 23, masking layer 84 is removed (e.g., as discussed above with regard to masking layer 80), and the formation of the gate electrodes is continued by removing (e.g., etching) the exposed portions of dielectric layers 26, 34, 38 and 42 and layer 24. After removal of ARC layer 82, processing continues in a similar fashion as described above with regard to FIG. 16. This alternative embodiment provides the advantage that only one of two masks has critical dimensions which provides cost and manufacturing advantages.

The above description is intended to describe at least one embodiment of the invention. The above description is not intended to define the scope of the invention. Rather, the scope of the invention is defined in the claims below. Thus, other embodiments of the invention include other variations, modifications, additions, and/or improvements to the above description.

In one embodiment, a method of forming a nanocluster charge storage device is provided. A substrate is provided. The substrate has a first dopant well associated with the nanocluster charge storage device and a second dopant well associated with a semiconductor device not having nanoclusters. A first gate stack is formed overlying the first dopant well and having a first conductive gate material layer that forms a gate electrode in the first gate stack. The first conductive gate material layer overlies a plurality of nanoclusters embedded in a first gate dielectric layer. The first conductive gate material layer underlies a portion of a second conductive gate material layer. A second gate stack is formed overlying the second dopant well using a portion of the second conductive gate material layer overlying the second dopant well as a gate electrode in the second gate stack. A portion of the second conductive gate material layer that overlies the first conductive gate material layer is removed.

In another form the portion of the second conductive gate material layer that overlies the first conductive gate material layer is removed by masking all areas away from the first dopant well and selectively etching the second conductive gate material layer. In a further embodiment, the first conductive gate material layer and the second conductive gate material layer are formed using doped polysilicon, a metal or a metal alloy. In yet a further embodiment, the first conductive gate material layer is implemented with a material that is different from the second conductive gate material layer.

In another further embodiment, the forming of the first gate dielectric layer is by forming a gate oxide layer and a second gate oxide layer overlying and surrounding the nanocluster layer. The first gate dielectric and the first conductive gate material layer are formed overlying both the first dopant well and the second dopant well. Selectively etching from areas overlying the second dopant well of the first conductive gate material layer occurs, the first gate dielectric layer and the nanocluster layer using a combination of a wet etch and a dry etch.

In another further embodiment, the second gate stack is formed by forming a second gate dielectric layer and the second conductive gate material layer overlying a portion of the second dopant well. The second conductive gate material layer overlies the second gate dielectric layer. In yet a further embodiment, the second gate dielectric layer is formed of silicon dioxide or silicon oxynitride.

In another further embodiment, a nitride layer is formed in the first gate stack and overlies the first conductive gate material and is between a portion of the first conductive gate material and the second conductive gate material. An oxide layer is formed overlying and in physical contact with the nitride layer. The nitride layer and oxide layer function as an etch stop layer when removing the second conductive gate material. The nitride layer also functions as an antireflective coating when forming the gate electrode in the first gate stack.

In another further embodiment, the first gate dielectric layer is formed of an oxide or an oxynitride of a compound containing at least one of hafnium, lanthanum, aluminum and silicon.

In another further embodiment, the plurality of nanoclusters embedded in the first gate dielectric layer overlying the first dopant well and the second dopant well are formed by forming a layer of doped or undoped semiconductor nanocrystals, metal nanocrystals, nanocrystals of two or more doped or undoped semiconductors, or metal alloy nanocrystals.

In another further embodiment, a first source and a first drain are formed around the first gate stack and within the first dopant well to form the charge storage device as a nonvolatile memory (NVM) transistor. A second source and a second drain are formed around the second gate stack and within the second dopant well to form a periphery transistor.

In another further embodiment, a semiconductor device is formed from the second gate stack. The semiconductor device enables charging and discharging of the nanocluster charge storage device.

In another embodiment, a method includes the following steps: providing a substrate; forming a first dopant well and a second dopant well in the substrate; forming a layer of nanoclusters embedded in a first gate dielectric overlying the first dopant well and the second dopant well; forming a first conductive gate material layer overlying the layer of nanoclusters; forming a nitride layer overlying the first conductive gate material layer; forming a storage stack overlying the first dopant well by patterning and removing the nitride layer, the first conductive gate material layer, and the layer of nanoclusters from areas other than overlying the first dopant well; forming a second gate dielectric overlying the second dopant well, the second gate dielectric having no nanoclusters; forming a second conductive gate material layer overlying the second gate dielectric and the storage stack; forming an anti-reflective coating layer overlying the second conductive gate material layer; patterning the second conductive gate material layer to form a first gate stack having the second conductive gate material layer as a gate electrode thereof while removing the second conductive gate material layer from the storage stack; and forming a second gate stack overlying the first dopant well by removing a portion of the storage stack, the second gate stack using the first conductive gate material layer as a gate electrode of a charge storage device having nanoclusters.

In a further embodiment, the method further includes the following steps: forming a first source and a first drain around the first gate stack and within the second dopant well to form a transistor; and forming a second source and a second drain around the second gate stack and within the first dopant well to complete formation of the charge storage device.

In another further embodiment, the method further includes the step of forming the first conductive gate material layer of doped polysilicon, metal or a metal alloy.

In another further embodiment, the method further includes the step of forming the second conductive gate material layer (44) of doped polysilicon, metal or a metal alloy In another further embodiment, the method further includes the step of forming the layer of nanoclusters embedded in the first gate dielectric overlying the first dopant well and the second dopant well by forming a layer of doped or undoped semiconductor nanocrystals, metal nanocrystals, nanocrystals of two or more doped or undoped semiconductors, or metal alloy nanocrystals.

In another further embodiment, the method further includes the step of forming the first gate dielectric of an oxide or an oxynitride of a compound containing at least one of hafnium, lanthanum, aluminum and silicon.

In another further embodiment, the method further includes the step of forming the second gate dielectric of silicon dioxide or silicon oxynitride.

In another embodiment, a method of forming a nanocluster charge storage device includes the following steps: providing a substrate having a memory dopant well associated with the nanocluster charge storage device and a periphery dopant well associated with a semiconductor device not having nanoclusters; forming a layer of nanoclusters embedded in a first gate dielectric overlying the memory dopant well; forming a first gate material layer overlying the layer of nanoclusters; patterning the layer of nanoclusters and the first gate material layer to exist only overlying the memory dopant well; forming a second gate material layer overlying the periphery dopant well and also overlying the layer of nanoclusters and the first gate material layer after formation of the first gate material layer; forming a periphery device gate stack by removing the second gate material layer from areas other than a predetermined periphery area overlying the periphery dopant well; and subsequently forming a nanocluster charge storage device gate stack by patterning the layer of nanoclusters and the first gate material layer overlying the memory dopant well, wherein the charge storage device gate stack is formed after formation of the periphery device gate stack even though the first gate material layer is formed prior to the second gate material layer.

In a further embodiment, the method further includes forming an etch stop layer directly overlying the first gate material layer for endpoint detection during removal of the second gate material layer overlying the first gate material layer.

In another embodiment, a method of forming a nanocluster charge storage device includes: providing a substrate having a memory dopant well associated with the nanocluster charge storage device and a periphery dopant well associated with a semiconductor device not having nanoclusters; forming a layer of nanoclusters embedded in a first gate dielectric overlying the memory dopant well; forming a first gate material layer overlying the layer of nanoclusters; patterning the layer of nanoclusters and the first gate material layer to exist only overlying the memory dopant well; forming a second gate material layer overlying the periphery dopant well and also overlying the layer of nanoclusters and the first gate material layer after formation of the first gate material layer; removing the second gate material layer from areas other than a predetermined periphery area overlying the periphery dopant well; and using a mask to selectively form at a substantially same time a periphery device gate stack and a nanocluster charge storage gate.

Many of the devices described herein may be conceptualized as having a control terminal which controls the flow of current between a first current handling terminal and a second current handling terminal. One example of such a device is a transistor. An appropriate condition on the control terminal of a transistor causes a current to flow from/to the first current handling terminal and to/from the second current handling terminal. Also, although field effect transistors (FETs) are frequently discussed as having a drain, a gate, and a source, in most such devices the drain is interchangeable with the source. This is because the layout and semiconductor processing of the transistor is frequently symmetrical.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Based on the teachings herein, those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the true spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. A method of forming a nanocluster charge storage device, comprising:
    providing a substrate having a first dopant well associated with the nanocluster charge storage device and a second dopant well associated with a semiconductor device not having nanoclusters;
    forming a first gate stack overlying the first dopant well and having a first conductive gate material layer that forms a gate electrode in the first gate stack, the first conductive gate material layer overlying a plurality of nanoclusters embedded in a first gate dielectric layer, the first conductive gate material layer underlying a portion of a second conductive gate material layer; and forming a second gate stack overlying the second dopant well using a portion of the second conductive gate material layer overlying the second dopant well as a gate electrode in the second gate stack, a portion of the second conductive gate material layer that overlies the first conductive gate material layer is removed.

2. The method of claim 1 further comprising:
removing the portion of the second conductive gate material layer that overlies the first conductive gate material layer by masking all areas away from the first dopant well and selectively etching the second conductive gate material layer.

3. The method of claim 1 further comprising:
forming the first conductive gate material layer and the second conductive gate material layer using doped polysilicon, a metal or a metal alloy.

4. The method of claim 3 further comprising:
implementing the first conductive gate material layer with a material that is different from the second conductive gate material layer.

5. The method of claim 1 further comprising:
forming the first gate dielectric layer comprising forming a gate oxide layer and a second gate oxide layer overlying and surrounding the nanocluster layer, wherein the first gate dielectric and the first conductive gate material layer are formed overlying both the first dopant well and the second dopant well; and
selectively etching from areas overlying the second dopant well the first conductive gate material layer, the first gate dielectric layer and the nanocluster layer using a combination of a wet etch and a dry etch.

6. The method of claim 1 further comprising:
forming the second gate stack by forming a second gate dielectric layer and the second conductive gate material layer overlying a portion of the second dopant well, the second conductive gate material layer overlying the second gate dielectric layer.

7. The method of claim 6 further comprising:
forming the second gate dielectric layer' of silicon dioxide or silicon oxynitride.

8. The method of claim 1 further comprising:
forming a nitride layer in the first gate stack and overlying the first conductive gate material and between a portion of the first conductive gate material and the second conductive gate material;
forming an oxide layer overlying and in physical contact with the nitride layer, the nitride layer and oxide layer functioning as an etch stop layer when removing the second conductive gate material and the nitride layer also functioning as an antireflective coating when forming the gate electrode in the first gate stack.

9. The method of claim 1 further comprising:
forming the first gate dielectric layer of an oxide or an oxynitride of a compound containing at least one of hafnium, lanthanum, aluminum and silicon.

10. The method of claim 1 further comprising:
forming the plurality of nanoclusters embedded in the first gate dielectric layer overlying the first dopant well and the second dopant well by forming a layer of doped or undoped semiconductor nanocrystals, metal nanocrystals, nanocrystals of two or more doped or undoped semiconductors, or metal alloy nanocrystals.

11. The method of claim 1 further comprising:
forming a first source and a first drain around the first gate stack and within the first dopant well to form the charge storage device as a nonvolatile memory (NVM) transistor; and
forming a second source and a second drain around the second gate stack and within the second dopant well to form a periphery transistor.

12. The method of claim 1 further comprising:
forming a semiconductor device from the second gate stack, the semiconductor device enabling charging and discharging of the nanocluster charge storage device.

13. A method comprising:
providing a substrate;
forming a first dopant well and a second dopant well in the substrate;
forming a layer of nanoclusters embedded in a first gate dielectric overlying the first dopant well and the second dopant well;
forming a first conductive gate material layer overlying the layer of nanoclusters;
forming a nitride layer overlying the first conductive gate material layer;
forming a storage stack overlying the first dopant well by patterning and removing the nitride layer, the first conductive gate material layer and the layer of nanoclusters from areas other than overlying the first dopant well;
forming a second gate dielectric overlying the second dopant well, the second gate dielectric having no nanoclusters;
forming a second conductive gate material layer overlying the second gate dielectric and the storage stack;
forming an anti-reflective coating layer overlying the second conductive gate material layer;
patterning the second conductive gate material layer to form a first gate stack having the second conductive gate material layer as a gate electrode thereof while removing the second conductive gate material layer from the storage stack; and
forming a second gate stack overlying the first dopant well by removing a portion of the storage stack, the second gate stack using the first conductive gate material layer as a gate electrode of a charge storage device having nanoclusters.

14. The method of claim 13 further comprising:
forming a first source and a first drain around the first gate stack and within the second dopant well to form a transistor; and
forming a second source and a second drain around the second gate stack and within the first dopant well to complete formation of the charge storage device.

15. The method of claim 13 further comprising:
forming the first conductive gate material layer of doped polysilicon, metal or a metal alloy.

16. The method of claim 13 further comprising:
forming the second conductive gate material layer (44) of doped polysilicon, metal or a metal alloy.

17. The method of claim 13 further comprising:
forming the layer of nanoclusters embedded in the first gate dielectric overlying the first dopant well and the second dopant well by forming a layer of doped or undoped semiconductor nanocrystals, metal nanocrystals, nanocrystals of two or more doped or undoped semiconductors, or metal alloy nanocrystals.

18. The method of claim 12 further comprising:
forming the first gate dielectric of an oxide or an oxynitride of a compound containing at least one of hafnium, lanthanum, aluminum and silicon.

19. The method of claim 13 further comprising:
forming the second gate dielectric of silicon dioxide or silicon oxynitride.

20. A method of forming a nanocluster charge storage device, comprising:
providing a substrate having a memory dopant well associated with the nanocluster charge storage device and a periphery dopant well associated with a semiconductor device not having nanoclusters;
forming a layer of nanoclusters embedded in a first gate dielectric overlying the memory dopant well;
forming a first gate material layer overlying the layer of nanoclusters;
patterning the layer of nanoclusters and the first gate material layer to exist only overlying the memory dopant well;
forming a second gate material layer overlying the periphery dopant well and also overlying the layer of nanoclusters and the first gate material layer after formation of the first gate material layer;
forming a periphery device gate stack by removing the second gate material layer from areas other than a predetermined periphery area overlying the periphery dopant well; and
subsequently forming a nanocluster charge storage device gate stack by patterning the layer of nanoclusters and the first gate material layer overlying the memory dopant well, wherein the charge storage device gate stack is formed after formation of the periphery device gate stack even though the first gate material layer is formed prior to the second gate material layer.

21. The method of claim 20 further comprising:
forming an etch stop layer directly overlying the first gate material layer for endpoint detection during removal of the second gate material layer overlying the first gate material layer.

22. A method of forming a nanocluster charge storage device, comprising:
providing a substrate having a memory dopant well associated with the nanocluster charge storage device and a periphery dopant well associated with a semiconductor device not having nanoclusters;
forming a layer of nanoclusters embedded in a first gate dielectric overlying the memory dopant well;
forming a first gate material layer overlying the layer of nanoclusters;
patterning the layer of nanoclusters and the first gate material layer to exist only overlying the memory dopant well;
forming a second gate material layer overlying the periphery dopant well and also overlying the layer of nanoclusters and the first gate material layer after formation of the first gate material layer;
removing the second gate material layer from areas other than a predetermined periphery area overlying the periphery dopant well; and
using a mask to selectively form at a substantially same time a periphery device gate stack and a nanocluster charge storage gate.

* * * * *